United States Patent [19]
Ruppel

[11] Patent Number: 4,727,594
[45] Date of Patent: Feb. 23, 1988

[54] UNIVERSAL LAND MOBILE RECEIVER IF SYSTEM

[75] Inventor: John S. Ruppel, N. Richland Hills, Tex.

[73] Assignee: Motorola, Inc., Schaumburg, Ill.

[21] Appl. No.: 909,344

[22] Filed: Sep. 19, 1986

[51] Int. Cl.[4] ............................................. H04N 1/26
[52] U.S. Cl. ..................................... 455/209; 455/314
[58] Field of Search ................ 455/207, 209, 314–316, 455/339

[56] References Cited
U.S. PATENT DOCUMENTS 2,534,606  12/1950  Kolster .................................. 455/314
3,372,339  3/1968  Harrison et al. ..................... 455/314

OTHER PUBLICATIONS
"Microwaves", vol. 17, No. 11, 11/1978.

Primary Examiner—Michael A. Masinick
Attorney, Agent, or Firm—Steven G. Parmelee

[57] ABSTRACT

An IF system that makes satisfactory use of a first IF stage frequency selected from between 108 MHz and 132 MHz to thereby provide an IF system that can be utilized in radios intended for reception in all land mobile frequency bands. The first IF stage (17) includes a high tolerance crystal filter (24) that contributes to the satisfactory reception performance of a radio so equipped.

10 Claims, 1 Drawing Figure

UNIVERSAL LAND MOBILE RECEIVER IF SYSTEM

TECHNICAL FIELD

This invention relates generally to radio receivers, and more particularly to the intermediate frequency (IF) section of a land mobile radio receiver.

BACKGROUND ART

Radio receivers are well known in the art. Such receivers typically include an antenna for transducing airborne radio frequency signals into electrical radio frequency signals. A preselector unit selects a predetermined band of the frequency spectrum, and a decoding unit functions to extract information that has been modulated in a preselected fashion with the signal of interest. Radios that can select a carrier signal in the land mobile low-band (30 to 50 MHz), mid-band (66 to 88 MHz), high-band (132 to 174 MHz), UHF-band (403 to 512 MHz), 800 MHz band (851 to 870 MHz), or 900 MHz band (935 to 941 MHz) are known as land mobile receivers, as these are the frequencies that the United States Federal Communications Commission (FCC) and/or other radio communications regulatory agencies of other countries have reserved for land mobile classified usage.

In general, such radios do not directly convert the radio frequency signal into an audible signal that constitutes a reproduction of the originally broadcast information signal. Instead, these radios usually include an IF section that first converts the RF signal to at least one IF signal (occasionally, a second or even a third IF stage will be used). This IF signal can then be processed to extract the information signal.

The specific frequency to which the IF section reduces (or, in some cases, increases) the RF signal cannot be selected at random. A poorly selected IF frequency can lead to poor receiver performance. For example, an IF frequency in the RF reception band poses obvious problems. Beyond this, harmonics of the various signals involved can restrict the list of potentially available frequencies for any given RF frequency even further. Therefore, although suitable IF frequencies for any given RF frequency signal of interest can be identified, care must be taken to avoid unsuitable IF frequencies At the same time, radio receiver manufacturers have a strong incentive to try and standardize the IF frequencies of choice, as this greatly simplifies manufacturing and inventory control. For example, an IF section that provides satisfactory performance in radios that receive signals in either the low-band or mid-band land mobile spectrum would allow a manufacturer to build and stock only one IF section instead of two. In fact, such design criteria does prevail, and at least one manufacturer of land mobile radio receivers offers a selection of land mobile radio receivers that receive variously in the low-band, mid-band, high-band, UHF-band, and 800 MHz band that rely upon only two IF sections.

Unfortunately, to date, and despite a strongly perceived need in the industry, no one has identified a means of providing a single IF frequency that can adequately service reception in all of the above noted land mobile bands. The recent introduction by the FCC of additional land mobile spectrum in the 900 MHz band only complicated the problem further Accordingly, there exists a need for a universal IF system suitable for use in land mobile radio receivers operating at any RF frequency currently allotted to this category of service. Further, radio performance should not be sacrificed to attain the efficiencies that would accompany use of such a universal system. In particular, EIA standard RS-204(c) defining high level reception in terms of spurious signal performance should be satisfied at all land mobile RF frequencies.

SUMMARY OF THE INVENTION

These needs and others are substantially met through provision of the universal land mobile receiver IF system disclosed below This IF system uses a first IF frequency selected from the range of 108 MHz to 132 MHz (with a preferable selection being made from the lower end of the above noted range) This IF frequency, operating in conjunction with the IF system of the invention, supports satisfactory reception performance and allows a single IF system to be used in all land mobile receivers regardless of what land mobile frequencies the radio is intended to receive.

The IF system operates in conjunction with an antenna and a preselector unit. The antenna receives airborne radio frequency transmitted information, wherein the information includes at least a carrier frequency signal and an information signal modulated therewith. The preselector receives the radio frequency signal and filters out all but a band of desired frequencies. This preselected band contains the carrier frequency signal of interest The IF system includes a first mixer that receives the carrier frequency signal of interest (along with any other signals appearing in the band passed through by the preselector unit) and that also receives a first injection signal having a frequency equal to the RF carrier frequency plus (or minus, as the case may be) a signal having a frequency equal to the desired first IF frequency noted above. As a result, the first mixer provides at its output a signal having a frequency equal to the desired first stage IF frequency. This frequency, of course, will be between 108 MHz and 132 MHz as indicated above.

The output of the first mixer connects to an amplifier, which in turn connects to a first IF filter. The first IF filter comprises a band pass filter centered at the IF frequency Given that the IF frequency must lie between 108 MHZ and 132 MHz, the filter must be carefully selected. Prior art crystal filters that have been used in other IF sections have a make tolerance that can vary from the desired frequency by plus/minus 4 kHz or more. Such crystals will not provide satisfactory reception performance MSX crystal filters, however, as manufactured and made available by Motorola, Inc. through its Components Division, 2553 N. Edgington St., Franklin Park, Ill. 60131, have a make tolerance of plus/minus 2 kHz or less. The applicant has discovered that such a high tolerance crystal will in fact allow the radio to provide reception performance that meets or exceed EIA standard RS-204(c) at all land mobile frequencies despite the use of a first IF frequency in excess of 108 MHz.

The output of the crystal filter connects through a second amplifier to a second mixer. The second mixer receives an injection frequency equal to the first IF frequency less 450 kHz to yield an output comprising a second IF frequency of 450 kHz. This second IF signal then passes through subsequent amplification, filtering, and limiting stages to a detector stage in accordance with well understood prior art technique.

The above generally described IF system meets all requirements of the long desired universal IF system for land mobile radio receivers. Through use of this system, a single IF section can be manufactured and inventoried for use on land mobile radios, regardless of what RF frequency the radio may be intended for use with. Further, the reception performance of such radios meets all appropriate performance standards, including EIA standard RS-204(c). This contributes to overall reduction in cost, simplified manufacturing and servicing, and improved performance.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
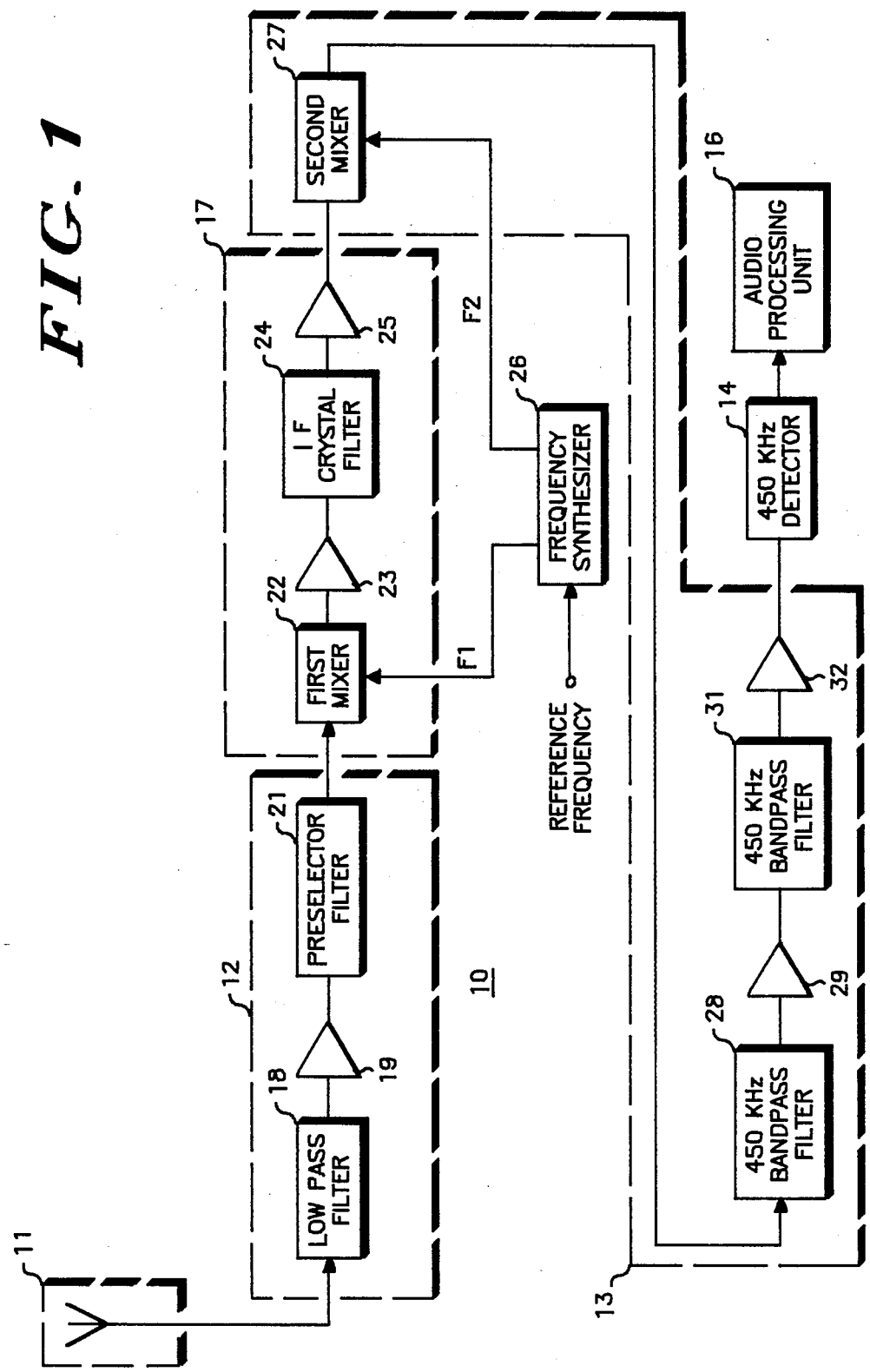
FIG. 1 comprises a block diagram depiction of the invention.

Referring now to the drawings, and in particular to FIG. 1, the invention can be seen as depicted generally by the numeral 10. The invention (10) operates in conjunction with an input unit (11), a preselector unit (12), a second IF frequency stage (13), a detector unit (14), and an audio processing unit (16). The invention itself can be comprised of a first IF frequency stage (17). With continued reference to FIG. 1, these generally referred to components will now be described in greater detail in seriatim fashion.

The input unit (11) can be comprised of an appropriate antenna for receiving airborne radio frequency signals and for transducing such signals into an electrical radio frequency signal. Such devices are well understood in the art and hence no more detailed description need be set forth here.

The preselector unit may be configured as desired in conformance with well understood prior art specifications. In the embodiment depicted, the preselector unit (12) includes a lowpass filter (18) for receiving the electric radio frequency signal from the input unit (11), a preamplifier (19) for amplifying the output of the lowpass filter (18), and a preselector filter (21) for receiving the preamplified output of the preamplifier (19) and for providing at the preselector output a signal comprising a frequency band of interest. In a land mobile radio such as the one depicted, the preselector filter (21) output will generally comprise a range of desired bandwidth in the land mobile low-band, mid-band, high-band, UHF band, 800 MHz, or 900 MHz band, as desired by the radio designer.

The first IF stage (17) includes a first mixer (22), a first amplifier (23), a crystal filter (24), and a second amplifier (25). The first mixer (22) receives the output of the preselector filter (21) and an injection signal (F1) as received from a frequency synthesizer (26) or other appropriate source. The output of the first mixer (22) comprises a carrier signal having the desired first stage IF frequency (as described below in more detail) and including the information modulated therewith. The output of the first mixer (22) passes through the first amplifier (23) to the crystal filter (24) which comprises a bandpass filter having a center frequency equal to the first IF stage frequency. The output of the crystal filter (24) passes through a second amplifier (25) and connects to the second IF stage (13).

The second IF stage (13) includes a second mixer (27), a first 450 kHz bandpass filter (28), a frequency sensitive amplifier (29) that amplifies any incoming signal having a frequency of 450 kHz, a second 450 kHz bandpass filter (31), and an amplifier/limiter (32). The second mixer (27) receives the output of the first IF stage (17) and an injection frequency (F2) from the frequency synthesizer (26). In the embodiment depicted, the injection frequency (F2) for the second mixer (27) will have a value equal to the frequency of the first IF stage (17) plus (or minus, as the case may be) 450 kHz. As a result, the second IF stage (13) has a carrier frequency of 450 kHz. The remaining components of the second IF stage (13) function to further isolate and make suitable for subsequent processing the 450 kHz signal in accordance with well understood prior art technique The detector (14) depicted in this embodiment can be any appropriate detector mechanism known in the prior art wherein the detector (14) functions to detect the intelligence that has been modulated on the above noted carriers and to provide that information at the output thereof The audio processing unit (16) receives this detected information and, in accordance with well understood prior art technique, renders this information audible or otherwise usable to the radio.

The criteria for selecting the frequency of the first IF stage (17) will now be set forth.

The first IF stage (17) frequency must avoid any land mobile broadcast bands and should further avoid interference from other extremely high power transmissions such as commercial FM and television broadcasts. For a wide-band radio intended for operation in land mobile frequencies, this would leave 50–54 MHz, 72–76 MHz, and 108–132 MHz as possibly available frequencies.

In order to ensure compliance with EIA standard RS-204(c), regarding spurious rejection at low-band reception, the first IF stage (17) frequency must exceed 54 MHz. This therefore excludes the first band noted above.

A first stage IF frequency in the 72–76 MHz band will not provide acceptable reception performance in the land mobile VHF band because of spurious signal performance that occurs at this band. More particularly, the necessary spurious signal rejection, when using a first stage IF frequency of 72–76 MHz, must come from the first IF stage mixer (22), which cannot currently be realized in any known cost effective manner The surviving suitable band comprises the 108–132 MHz band. The prior art would also have rejected this band as unsuitable for land mobile receiver use as well. As indicated above, however, a first stage IF frequency within this range can be satisfactorily implemented through provision of the applicant's IF system (10), which makes particular use of an IF crystal filter (24) having a relatively precise frequency tolerance Beyond this, the precise frequency of the first IF stage (17) needs to take into consideration other factors as well, such as the intended frequency of the second IF stage (13), if any. In the example indicated, the second IF stage (13) has a frequency of 450 kHz. This therefore requires that the first IF stage have a frequency of at least 108.9 MHz, (108 MHz plus 450 kHz plus 450 kHz). In the particular embodiment depicted, a first stage IF frequency of 109.65 MHz was selected to accommodate available outputs of the frequency synthesizer (26).

Those skilled in the art will appreciate that various modifications of the above described embodiment could be implemented without parting from the spirit and scope of the invention described. Therefore, it should be understood that the claims are not to be considered as being limited to the particular embodiment depicted in the absence of specific limitations directed to such limitations.

I claim:

1. A radio receiver having:
   input means for receiving radio frequency signals comprising a carrier frequency signal and an information signal modulated therewith;
   preselector means for receiving said radio frequency signals from said input means and for providing a frequency selective signal based upon a desired carrier frequency signal, wherein said carrier frequency signal may be any frequency preselected from between 30 MHz to 50 MHz, 66 MHz to 88 MHz, 132 MHz to 174 MHz, 403 MHz to 512 MHz, 851 MHz to 870 MHz, and 935 MHz to 941 MHz; and
   first intermediate frequency means for receiving said frequency selective signal and for converting said carrier frequency signal component of said radio frequency transmitted information to a first preselected intermediate frequency;
   wherein said first preselected intermediate frequency has a value between 108 MHz and 132 MHz regardless of the frequency of said carrier frequency signal.

2. The radio receiver of claim 1 wherein said intermediate frequency means includes filter means for band pass filtering said preselected intermediate frequency.

3. The radio receiver of claim 2 wherein said filter means has a make tolerance of at least plus/minus 2 kHz.

4. The radio receiver of claim 1 wherein said preselected intermediate frequency at least equals 109.65 MHz.

5. The radio receiver of claim 1 wherein said preselected intermediate frequency substantially equals 109.65 MHz.

6. The radio receiver of claim 1 wherein said intermediate frequency means includes a second intermediate frequency stage that converts said first preselected intermediate frequency to a second, lower frequency.

7. The radio receiver of claim 6 wherein said first preselected intermediate frequency substantially equals 109.65 MHz and said second, lower frequency of said second intermediate frequency stage substantially equals 450 kHz.

8. A method of receiving radio frequency signals comprising a carrier frequency signal and an information signal modulated therewith, comprising the steps of:
   (A) preselecting said radio frequency signals and providing a frequency selective signal based upon a desired carrier frequency signal, wherein said carrier frequency signal may be any frequency preselected from between 30 MHz to 50 MHz, 66 MHz to 88 MHz, 132 MHz to 174 MHz, 403 to 512 MHz, 851 MHz to 870 MHz, and 935 MHz to 941 MHz;
   (B) converting said carrier frequency selective signal to a first preselected intermediate frequency, wherein said preselected intermediate frequency has a value between 108 MHz and 132 MHz, regardless of the frequency of said carrier frequency signal;
   (C) further processing said first preselected intermediate frequency to retrieve said information signal.

9. The method of claim 8 wherein said first preselected intermediate frequency substantially equals 109.65 MHz.

10. The method of claim 8 wherein said preselected intermediate frequency at least equals 109.65 MHz.

* * * * *

UNITED STATES PATENT AND TRADEMARK OFFICE
CERTIFICATE OF CORRECTION

PATENT NO. : 4,727,594

DATED : February 23, 1988

INVENTOR(S) : Ruppel, John Stephen

It is certified that error appears in the above-identified patent and that said Letters Patent is hereby corrected as shown below:

Column 6, line 1, before the word "preselected" please insert the word --first--.

Column 6, line 4, before the word "preselected" please insert the word --first--.

Signed and Sealed this

Second Day of August, 1988

Attest:

DONALD J. QUIGG

Attesting Officer

Commissioner of Patents and Trademarks